United States Patent
Bryant et al.

[11] Patent Number: 5,403,777
[45] Date of Patent: Apr. 4, 1995

[54] SEMICONDUCTOR BOND PAD STRUCTURE AND METHOD

[75] Inventors: Frank R. Bryant, Denton, Tex.; Fusen E. Chen, Milpitas, Calif.

[73] Assignee: SGS-Thomson Microelectronics, Inc., Carrollton, Tex.

[21] Appl. No.: 182,845

[22] Filed: Jan. 14, 1994

Related U.S. Application Data

[62] Division of Ser. No. 919,949, Jul. 27, 1992, Pat. No. 5,309,025.

[51] Int. Cl.[6] .................... H01L 21/00; H01L 21/44
[52] U.S. Cl. .................................. 437/183; 437/189; 437/190
[58] Field of Search ............... 437/183, 189, 190, 228; 156/656, 657

[56] References Cited

U.S. PATENT DOCUMENTS

| | | | |
|---|---|---|---|
| 5,149,671 | 9/1992 | Koh et al. | 437/183 |
| 5,284,797 | 2/1994 | Heim | 437/183 |
| 5,316,976 | 5/1994 | Bourg, Jr. et al. | 437/189 X |

*Primary Examiner*—Thi Dang
*Attorney, Agent, or Firm*—Kenneth C. Hill; Lisa K. Jorgenson; Richard K. Robinson

[57] ABSTRACT

A method for forming an improved bonding pad structure. A bond pad structure is formed by depositing a barrier layer over an underlying region of a semiconductor device, and then depositing a first conductive layer over the barrier layer. The barrier layer and conductive layer are then patterned and etched to define a conductive region. In a preferred embodiment, the conductive region is formed in the shape of a grid. A second conductive layer is deposited over the conductive region and a portion of the exposed underlying region. The second conductive layer makes a good adhesive contact with the underlying region, thus preventing bond pad lift off.

13 Claims, 2 Drawing Sheets

SEMICONDUCTOR BOND PAD STRUCTURE AND METHOD

This is a division of application Ser. No. 07/919,949, filed Jul. 27, 1992, now U.S. Pat. No. 5,309,025.

BACKGROUND OF THE INVENTION

1. Field of the Invention:

The present invention relates generally to semiconductor integrated circuits, and more specifically to formation of a bond pad structure for such circuits.

2. Description of the Prior Art:

After an integrated circuit device has completed the fabrication process, it is usually assembled into a package to be utilized on a printed circuit board as part of a larger circuit. In order for the inner leads of the package to make electrical contact with the bonding pads of the fabricated device, a metal bond is formed at the bonding pad of the device with a lead extending to the inner lead of the package lead frame.

During the formation of a bond, bond pad lift off may occur. This problem results when the large, heavy bond is placed on top of layers which have not formed a strong adhesion to the underlying layers. During formation of aluminum interconnect, it is common to form an underlying barrier layer of a material such as titanium nitride. This barrier layer is utilized to prevent the aluminum from spiking into any underlying conductive layers during later fabrication steps. However, the barrier layer, which is usually titanium nitride, does not form a strong adhesion to the oxide underlying the bond pad, and may separate during the bonding process.

Therefore, it would be desirable to provide a method for forming an improved bond pad structure whereby a bond may be formed at a bonding pad which is resistant to layer separation at the bond pad.

SUMMARY OF THE INVENTION

A method is disclosed for forming an improved bonding pad structure. A bond pad structure is formed by depositing a barrier layer over an underlying region of a semiconductor device, and then depositing a first conductive layer over the barrier layer. The barrier layer and conductive layer are then patterned and etched to define a conductive region. In a preferred embodiment, the conductive region is formed in the shape of a grid. A second conductive layer is deposited over the conductive region and a portion of the exposed underlying region. The second conductive layer makes a good adhesive contact with the underlying region, thus preventing bond pad lift off.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
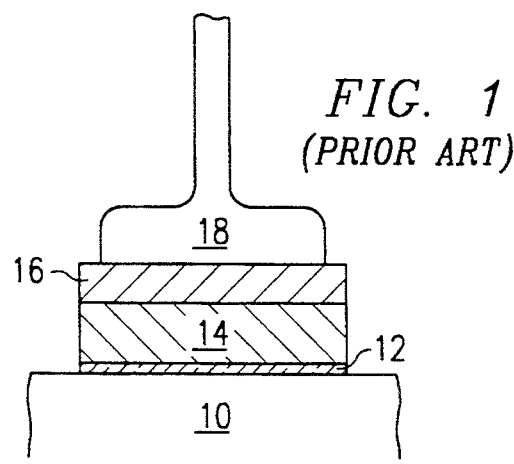
FIG. 1 is a sectional view of an integrated circuit illustrating a wire lead bonded to an integrated circuit substrate according to the prior art.

FIG. 1 depicts a prior art method for forming a bond in an integrated circuit. Referring to FIG. 1, a bond is formed over an underlying region 10 in an integrated circuit. Underlying region 10 may be either a semiconductor substrate or an underlying insulating layer. Underlying region 10 is typically field oxide in the peripheral region of the integrated circuit. A barrier layer 12 is deposited over the device, followed by a first conductive layer 14. A second conductive layer 16 may later be deposited over first conductive layer 14. A bond 18 is then formed from second conductive layer 16 to a lead in the package used to house the integrated circuit device.

In one prior art embodiment, underlying region 10 may be oxide, barrier layer 12 may be titanium nitride, and first conductive layer 14 and second conductive layer 16 may be aluminum. Those skilled in the art will appreciate that forming bond 18 may cause the titanium nitride layer 12 to separate from the oxide layer 10.

Figure 2:
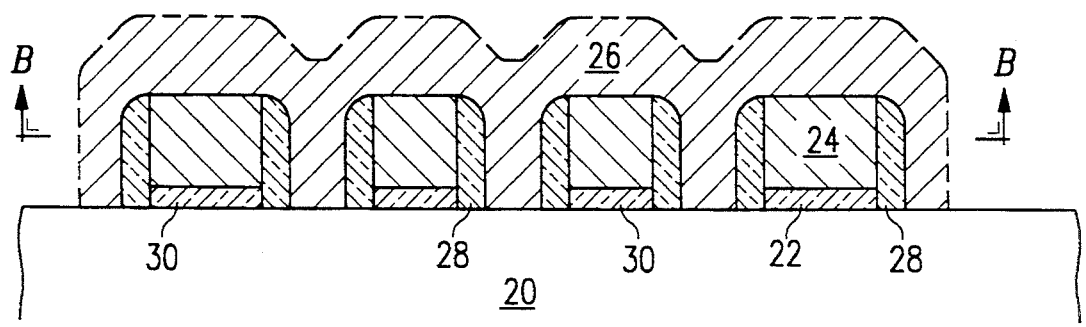
FIG. 2 is a sectional view of an integrated circuit taken along the line A—A in FIG. 3, illustrating a wire lead bonded to an integrated circuit substrate according to the present invention.
Figure 3:
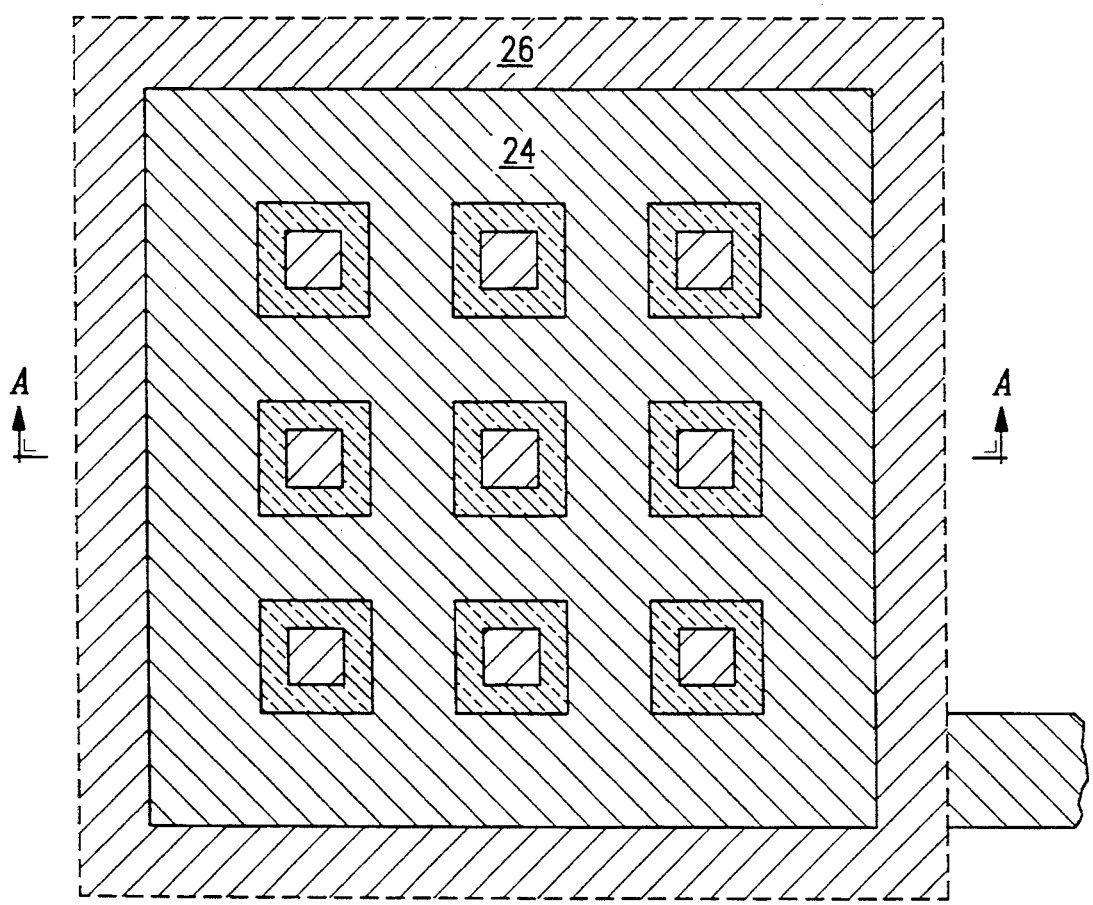
FIG. 3 is a sectional view of an integrated circuit taken along the line B—B in FIG. 2, illustrating a wire lead bonded to an integrated circuit substrate according to the present invention.

FIGS. 2 and 3 depict a preferred method for forming an improved bond pad in an integrated circuit. Referring to FIG. 2, a bond pad will be formed over an underlying region 20 in an integrated circuit. Underlying region 20 may be either a semiconductor substrate or an underlying insulating layer. A barrier layer 22, such as titanium nitride is deposited over the device, followed by a first conductive layer 24, typically of aluminum. These are the conductive and barrier layers deposited during the typical fabrication process to form a first metal interconnect layer. As known in the art, barrier layer 22 does not adhere well to underlying layer 20, which causes bond pad lift off problems in the prior art method as described above.

A first insulating layer (not shown) is then deposited over first conductive layer 24, as is typically performed during processing to form an interlevel dielectric layer. The device is then patterned and etched to remove a portion of the first insulating layer, leaving only residual sidewalls 28. This step is typically performed during formation of a via between two conductive layers elsewhere in the device. The patterning and etching steps form a conductive region 30 which is comprised of barrier layer 22, first conductive layer 24 and residual sidewalls 28. Those skilled in the art will appreciate that a conductive lead typically extends from first conductive region 30 to be utilized for connection to other parts of the chip. A second conductive layer 26 is then deposited over conductive region 30 and exposed portions of underlying region 20 to define a bond pad. A bond will be made to second conductive layer 26. In one embodiment, first conductive layer 24 may be aluminum, barrier layer 22 may be titanium nitride, residual sidewalls 28 may be oxide, and underlying region 20 may be oxide. Second conductive layer 26 may be comprised of a layer of aluminum, a layer of titanium and a layer of aluminum, a layer of titanium and a layer of aluminum and a layer of titanium nitride, a layer of tungsten, or a layer of titanium and tungsten composite. Alternatively, underlying region 20 may be polycrystalline silicon.

Referring now to FIG. 3, there is depicted a top view of a bond pad in accordance with the present invention. In a preferred embodiment, first conductive layer 24 is patterned and etched to form conductive region 30 in the shape of a grid. Second conductive layer 26 is then deposited over conductive region 30 to form a bond pad. Second conductive layer 26 directly contacts underlying region 20 through the holes in the grid. In this manner, second conductive layer 26 contacts the oxide of underlying region 20 which provides a good adhesive surface. Second conductive layer 26 is now well attached so that lift off will not occur during bonding.

Figure 4:
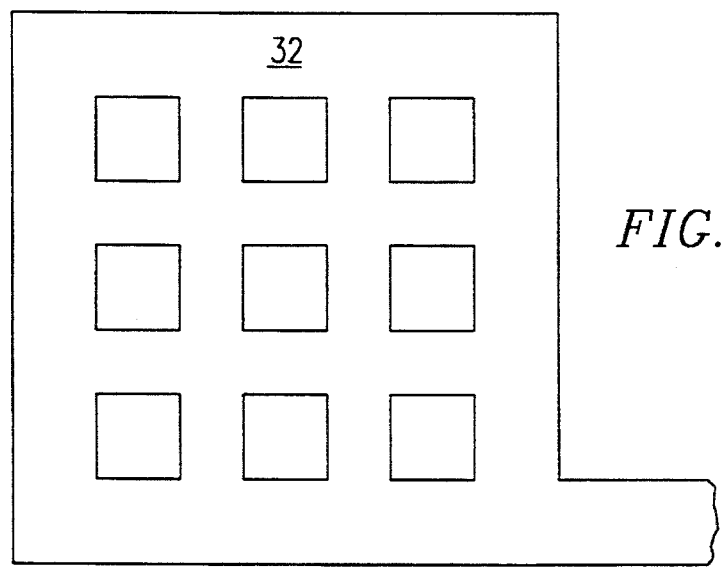
FIGS. 4 and 5 are top views of masks utilized for patterning layers of an integrated circuit substrate.
Figure 5:
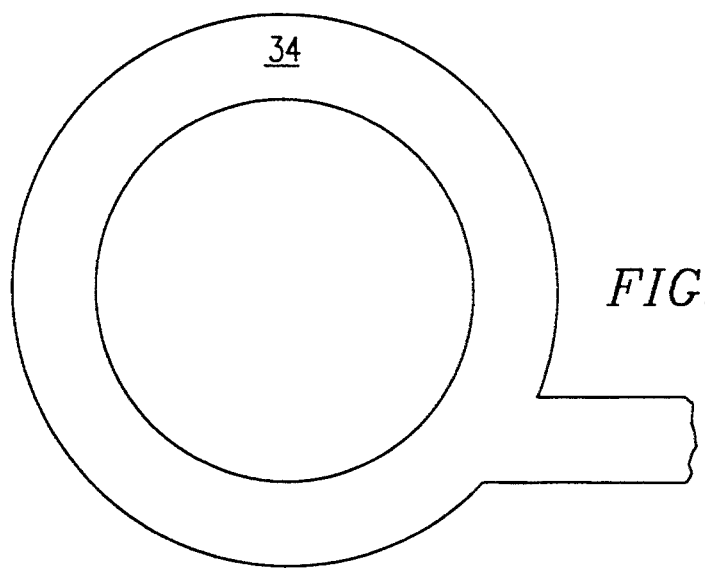

FIGS. 4 and 5 depict masks utilized for patterning layers of an integrated circuit substrate to be utilized for a bond pad. Referring to FIG. 4, in a preferred embodiment of the present invention, mask 32 is utilized to form a conductive region 30 in the shape of a grid in first conductive layer 24. Second conductive layer 26 is deposited over conductive region 30 and directly contacts underlying region 20 around the sides of conductive region 30 and also through the holes in the grid. A grid pattern allows enough of first conductive layer 24 to remain after the etching process so that first conductive layer 24 may be probe tested in a normal manner before the deposition of second conductive layer 26 and provides surface interconnect for electrical contact between first conductive layer 24 and second conductive layer 26.

Referring now to FIG. 5, in one embodiment of the present invention, mask 34 is utilized to form a conductive region 30 in the shape of a ring. In this embodiment, a larger area of second conductive layer 26 will directly contact underlying region 20 thus further improving the adhesiveness among the layers. However, the area of first conductive layer 24 has decreased making probing more difficult. Other shapes, such as rectangles, may be used as a mask to pattern first conductive layer 24.

As will be appreciated by those skilled in the art, the method described above, and the structure formed thereby, provides for an improved bonding pad by improving the adhesiveness among underlying layers of an integrated circuit device. By patterning and etching a first conductive layer 24 to expose a portion of the underlying oxide layer and then depositing a second conductive layer 26 over conductive regions formed from the first conductive layer 24, an improved bond pad is formed.

In an alternate embodiment, a third conductive layer may be deposited over the device while maintaining the improved adhesion between the layers.

While the invention has been particularly shown and described with reference to a preferred embodiment, it will be understood by those skilled in the art that various changes in form and detail may be made therein without departing from the spirit and scope of the invention.

What is claimed is:

1. A method for forming a bonding pad for an integrated circuit, comprising the steps of:
   depositing a barrier layer over an underlying region of a semiconductor device;
   depositing a first conductive layer over the barrier layer;
   patterning and etching the first conductive layer and the barrier layer to define at least one conductive region, wherein a portion of the underlying region is exposed; and
   depositing a second conductive layer over the first conductive layer, wherein the second conductive layer defines a bond pad and contacts the at least one conductive region and the exposed underlying region.

2. The method according to claim 1, further comprising, after the step of patterning and etching the first conductive layer:
   depositing a first insulating layer over of the at least one conductive region; and
   performing an etch through the first insulating layer to form residual sidewalls along vertical sides of each conductive region.

3. The method according to claim 2, wherein the step of performing an etch exposes an upper surface of the at least one conductive region and part of the exposed portion of the underlying region.

4. The method according to claim 1, wherein the step of patterning and etching the first conductive layer and the barrier layer further comprises the step of patterning and etching such layers so that the conductive region forms the shape of a grid.

5. The method according to claim 1, wherein the step of patterning and etching the first conductive layer and the barrier layer further comprises the step of patterning and etching such layers so that the conductive region forms the shape of a polygon.

6. The method according to claim 1, wherein the step of patterning and etching the first conductive layer and the barrier layer further comprises the step of patterning and etching such layers so that the conductive region forms the shape of a ring.

7. The method according to claim 2, wherein the first insulating layer is comprised of oxide.

8. The method according to claim 1, wherein the barrier layer is comprised of titanium nitride.

9. The method according to claim 1, wherein the first conductive layer is comprised of polycrystalline silicon.

10. The method according to claim 1, wherein the first conductive layer is comprised of metal.

11. The method according to claim 10, wherein the metal is aluminum.

12. The method according to claim 1, wherein the underlying region comprises a second insulating layer.

13. The method according to claim 12, wherein the second insulating layer is comprised of oxide.

* * * * *